United States Patent [19]

Bencuya

[11] Patent Number: 5,430,324
[45] Date of Patent: Jul. 4, 1995

[54] HIGH VOLTAGE TRANSISTOR HAVING EDGE TERMINATION UTILIZING TRENCH TECHNOLOGY

[75] Inventor: Izak Bencuya, San Jose, Calif.

[73] Assignee: Siliconix, Incorporated, Santa Clara, Calif.

[21] Appl. No.: 918,996

[22] Filed: Jul. 23, 1992

[51] Int. Cl.⁶ .................... H01L 23/58; H01L 29/76; H01L 29/94
[52] U.S. Cl. .................... 257/495; 257/330; 257/339; 257/490; 257/491
[58] Field of Search ............ 257/330, 331, 339, 341, 257/409, 490, 495, 329, 491

[56] References Cited

U.S. PATENT DOCUMENTS

| | | | |
|---|---|---|---|
| 3,984,859 | 10/1976 | Misawa et al. | 257/495 |
| 3,994,011 | 11/1976 | Misawa et al. | 257/495 |
| 5,072,266 | 12/1991 | Bulucea et al. | 257/339 |
| 5,233,215 | 8/1993 | Baliga | 257/490 |

FOREIGN PATENT DOCUMENTS

| | | | |
|---|---|---|---|
| 61-137368 | 6/1986 | Japan | 257/495 |
| 63-263769 | 10/1988 | Japan | 257/339 |
| 3-155167 | 7/1991 | Japan | 257/339 |

OTHER PUBLICATIONS

IEEE Transactions on Electron Devices, vol. ED27, No. 2, Feb. 1980, New York, "A 600-Volt MOSFET Designed For Low On-Resistance", by Victor A. K. Temple, et al. pp. 343-349.

IEEE Transactions on Electron Devices, vol. ED34, No. 4, Apr. 1987, New York, "An Ultra-Low On-Resistance Power MOSFET Fgabricated by Using a Fully Self-Aligned Process", by Daisuke Ueda, et al. pp. 926-930.

Japanese Journal of Applied Physics, Supplements, (18th Int. Conf. on Solid State Devices and Materials, Tokyo 1986), Aug. 20-22, "A New Injection Suppression Structure For Conductivity Modulated Power MOSFETs", by Daisuke Ueda, et al. pp. 97-100.

*Primary Examiner*—Steven Ho Yin Loke
*Attorney, Agent, or Firm*—Skjerven, Morrill, MacPherson, Franklin & Friel; Norman R. Klivans

[57] ABSTRACT

For a vertical DMOS power transistor or a high voltage bipolar transistor, an edge termination at the perimeter of the die surrounding the active transistor cells includes multiple spaced apart field rings. A trench is located between each adjacent pair of field rings and is insulated either by oxide formed on the sidewalls thereof or by an oxide filling. The insulated trenches allow the field rings to be very closely spaced together. Advantageously the trenches may be formed in the same process steps as are the trenched gate electrodes of the active portion of the transistor. This structure eliminates the necessity for fabricating thick field oxide underlying a conventional field plate termination, and hence allows fabrication of a transistor without the need for a field plate termination, and in which the multiple field rings are suitable for a transistor device having a breakdown voltage in the range of 20 to 150 volts. The trenches advantageously eliminate the process sensitivity of using multi field ring terminations with low resistivity semiconductor material.

11 Claims, 4 Drawing Sheets

HIGH VOLTAGE TRANSISTOR HAVING EDGE TERMINATION UTILIZING TRENCH TECHNOLOGY

FIELD OF THE INVENTION

This invention is directed to high voltage transistors and especially to field effect power transistors having terminations around the edge of the die to increase breakdown voltage.

DESCRIPTION OF THE PRIOR ART

Power field effect transistors are well known. Such transistors are often for instance DMOS transistors which are field effect transistors formed in a substrate on which is grown an epitaxial layer and including a doped source region, a doped body region, and a gate electrode of conductive polysilicon formed in a trench. Typically a number of such transistors (cells) connected in parallel are formed on one die for power applications, i.e. for handling power greater than 1 watt or for other high voltage applications. It is well known in this vertical DMOS technology to use edge termination techniques to terminate junctions (doped regions) at the edge of the silicon die on which the transistors are formed, such that the breakdown voltage at the edge will be higher than that of the active transistor cells in the central portions of the die.

In order to achieve higher breakdown voltage than the limited breakdown provided by the junction (doped region) depths, it is known to use a field plate 10 as shown in FIG. 1. Field plate 10 enhances breakdown voltage as a result of high electric fields at the edge 12 of the die. Field plate 10 is a conductive structure overlapping the edge 14 of the doped region 16 in substrate 17. The field plate 10, which is electrically connected to the last active junction helps adjust the depletion layer shape at the underlying doped region 16. As shown, field plate 10 (surrounded by insulating layer 20) includes doped polysilicon portion 11 and metal contact 22 to doped region 16.

A second approach to achieve higher breakdown voltage used in conjunction with or in place of a field plate is a diffused field ring 32 as in FIG. 2. Field ring 32 is a doped region formed surrounding the transistor cells such as doped region 30 contacted by metallization 34 and located towards the edge 12 of the die. Field rings are typically floating (not connected to any external source of voltage) from the active portion 30 of the transistor and located relatively close thereto. Field rings such as 32 are typically fabricated simultaneously with portions such as 30 of the active transistor, i.e. in the same processing step, by creating an extra diffusion window in the mask that surrounds the active portions of the transistor. Typically therefore the diffusion depth and doping level of the field ring 32 is identical to that of a corresponding region 30 of the active part of the transistor.

It is well known to use multiple (three or more) field rings arranged concentrically and spaced apart, especially with transistor devices subject to voltages over 150 volts. The spaced-apart distance between adjacent field rings required for them to be effective is typically approximately in the range of 1 micrometer for the epitaxial layer resistivities typically used in such devices. Due to process variation of the doped region depths and alignment tolerances and line width control, however, conventional field rings are not reliable for breakdown voltages below 150 volts. This is because for semiconductor material resistivity used for devices with less than 150 volts breakdown voltage, the field rings have to be made very close to the source junction in order to shield electric field in that junction. The proximity becomes unpractical and unmanufacturable since it has to be a fraction of a micron. Hence for such devices the field plate termination is the only prior art alternative.

Disadvantageously, however, field plates require a relatively thick oxide insulating layer underlying the field plate to insulate the field plate from the underlying substrate. This is in order to support the needed voltage and decrease the surface electric fields in the silicon substrate which may undesirably cause hot electron injection into the insulating oxide, making the oxide unstable in the avalanche condition of the transistor. Formation of this thick oxide layer requires an additional masking step and a relatively long oxidation step. Undesirably these steps increase cost and complication of the fabrication of the transistor device. However if these steps were to be eliminated, the oxide underneath the field plate of necessity would be the gate oxide only which is a relatively thin layer approximately 0.05 micrometers thick. Such a thickness of oxide insulating layer underneath the field plate would be useful only for a breakdown voltage of 20 volts or less. Hence such a structure would not be suitable for typical DMOS transistor voltages of 20 volts and greater.

Thus in the range of breakdown voltages of about 20 volts to about 150 volts, conventional field rings are not effective and the conventional field plates are useful only with the complication of the extra masking and oxidation steps.

Thus there is a need for a termination structure suitable for transistors operating especially in the 20 volt to 150 volt range, where the termination structure does not require an extra masking or other fabrication step. Such would be possible if the field rings could be more closely spaced apart; however of necessity the prior art field rings must be spaced well apart since if they overlap, i.e. the doped areas of adjacent field rings intersect, the benefit of multiple field rings is lost and the field rings are effectively reduced to being a single field ring, with much of the increased breakdown voltage benefit being lost. It would thus be extremely useful if a process could be found for making field rings located very close to one another. No such structure or process is known in the prior art.

SUMMARY OF THE INVENTION

In accordance with the invention, a transistor edge termination structure includes multiple field rings which are spaced more closely together than in the prior art, adjacent field rings being separated by insulating regions which are trenches lined with an insulating material such as silicon dioxide. These trenches allow the field rings to be spaced as close together as the width of the trenches, and hence multiple field rings may be used.

The described embodiment herein is for this termination used with a field effect transistor; this termination is also useful for a high voltage bipolar transistor.

The trenches prevent the overlap of adjacent diffused junctions (which are the field rings or a transistor cell), and also allow the spacing of the field rings at a constant distance. This advantageously eliminates the process sensitivity of using multi field ring terminations for low resistivity semiconductor material. The trenches may be completely filled with an insulating material such as an oxide material, or alternatively the trench sidewalls may be lined with an oxide or other insulator and the remainder portion of the trench filled with for instance doped polysilicon. A trench filled with doped polysilicon may be electrically connected to the gate contact of the active portion of the transistor device.

Typically the field rings (as is conventional) are formed in the same process step as for instance are the deep body regions of the active transistor cells. The trenches are formed in the same process step as are the gate trenches of the active transistor cells, and the remaining steps of oxidizing and filling the trenches also are performed simultaneously with identical steps in the formation of the transistor cell gate electrodes.

Typically the depth of the field rings is greater than that of the trenches. The relative depth is dependent on the fabrication process and the resistivity of the semiconductor epitaxial layer and/or substrate. Generally the trench depth is such that given the maximum process variations in terms of trench etching and field ring diffusion, the field ring diffusion will always be deeper in the substrate than is the bottom of the trench.

Thus the effect of the trench is to enable placement of the field rings at much closer spacing at the surface of the substrate than is possible in the prior art. The trenches may be formed either before or after implantation and diffusion of the field rings. In addition to provision of the trenches separating the field rings, it is also possible to provide a field plate in accordance with the invention. This field plate is conventional (but need not be formed on a thick oxide layer) and is located to extend outside the perimeter of the outermost field ring.

Thus advantageously one may provide a termination structure which does not require formation of a thick oxide insulating layer as required for a prior art field plate, but which improves breakdown voltage for multiple field rings, especially for devices in the 20 volt to 150 volt breakdown voltage range. This structure is relatively economical to fabricate and provides the needed performance in terms of breakdown voltage. Also, elimination of the thick oxide layer underneath a field plate allows the other process steps to be more self aligned, thus improving fabrication yields.

DETAILED DESCRIPTION OF THE INVENTION

Figure 1:
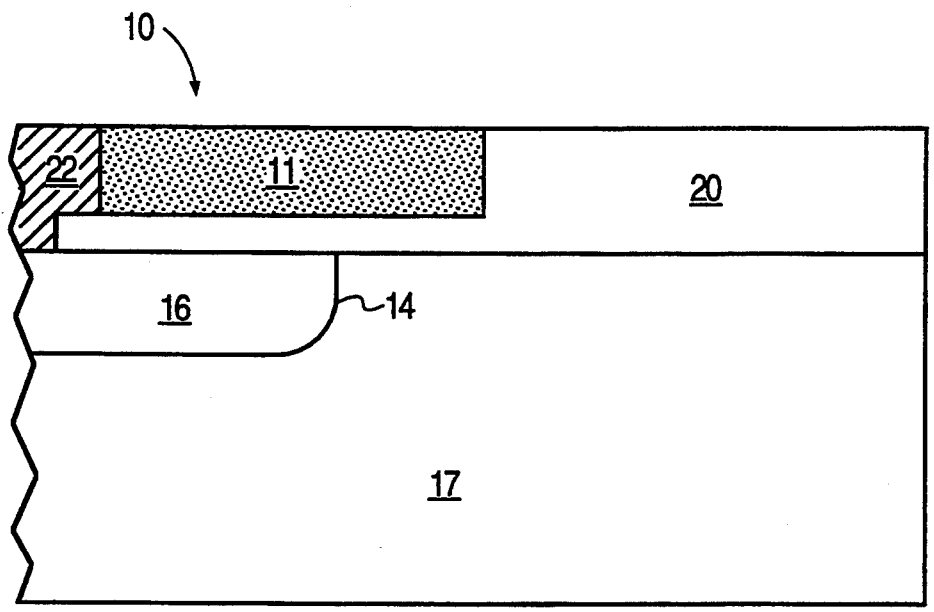
FIG. 1 shows in cross section a prior art field plate.
Figure 2:
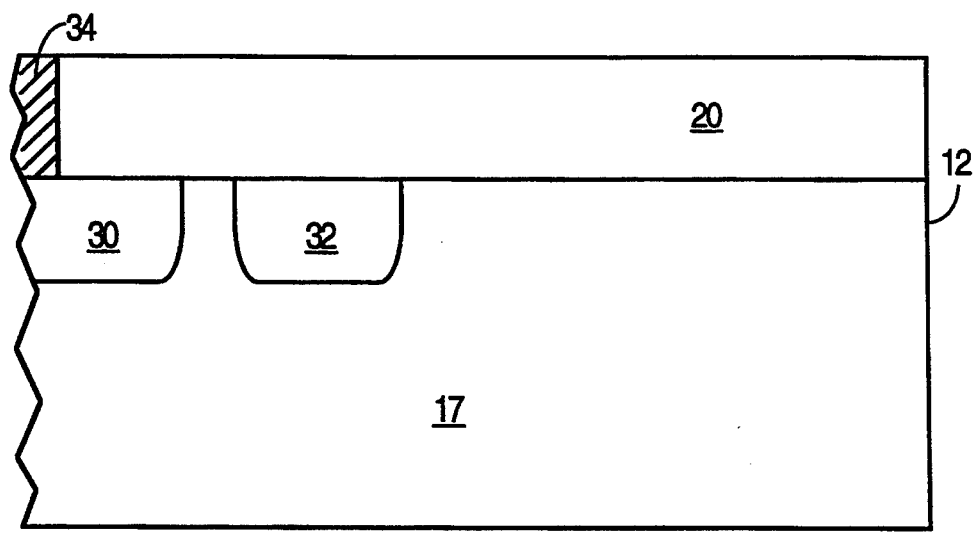
FIG. 2 shows in cross section a prior art field ring.
Figure 3:
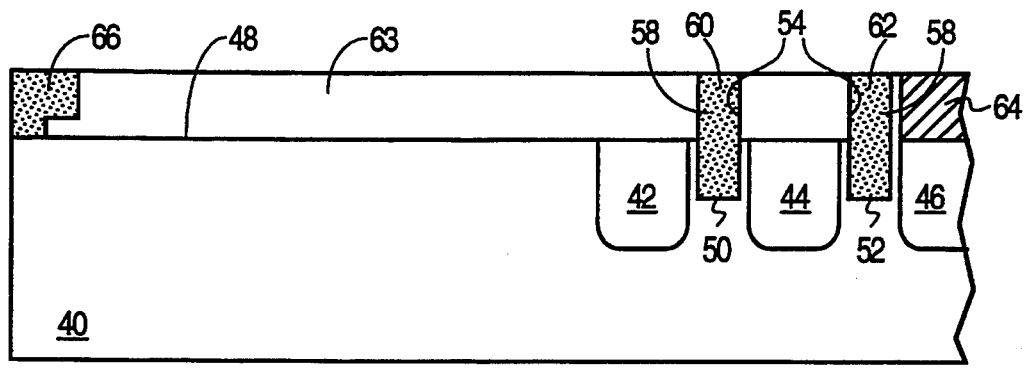
FIG. 3 shows in cross section an edge termination including field rings and trenches in accordance with the invention.

FIG. 3 shows a field effect transistor termination structure in accordance with the invention. Formed in epitaxial layer 40 of a semiconductor substrate are field rings 42, 44, and deep body region 46 of the outer active cell of the transistor, which includes a dummy (inactive) cell in the left hand portion of deep body region 46. Regions 42, 44, 46 are each a doped region approximately 7 microns wide at the principal surface 48 of the substrate 40 and approximately 2.5 microns deep. The field rings 42, 44 have a conductivity type opposite to that of the surrounding epitaxial layer 40 and have a doping concentration at the surface 48 of approximately $10^{18}$ to $10^{19}$ion/cm$^3$. (In FIGS. 3, 4a, 4b, 4c the edge of the die is at the left hand portion of the figure. In FIGS. 5a to 5j the edge of the die is at the right hand portion of the figure.)

Formed respectively between adjacent field rings 42, 44 and between field ring 44 and deep body region 46 is a trench 50, 52 approximately 1 to 2 microns deep and approximately one to two microns wide. Each trench 50, 52 is lined with a layer 54 of silicon dioxide approximately 500 to 1,000 Å thick and filled with doped polysilicon 58. As shown, trench 50, 52 is electrically connected to respectively polysilicon electrode 62, 62 immediately over the center portion of trench 50, 52 which contacts the doped polysilicon filling 58 of trench 50, 52. Electrode 62 e.g. is formed in a insulating layer 63. Conventional source metallization 64 contacts deep body region 46.

Field rings 42, 44 are floating. The innermost trench 52 may be electrically connected via its electrode 62 to the gate contact (not shown) of the active transistor cells.

Also shown is a conventional conductive guard ring 66 at the outermost edge portion of the transistor die. It is to be understood that in FIG. 3 the active transistor cells (except for deep body region 46) are not shown. However, they are conventional in shape and typically are square cells in plan. The trenches 50, 52 allow the field rings 42, 44 to be formed quite close together and also close to active cell region 46; the trenches eliminate any overlapping of adjacent diffused regions due for instance to process variations. This advantageously allows the diffusions to be spaced as close together as the width of the trenches.

Figure 4A:
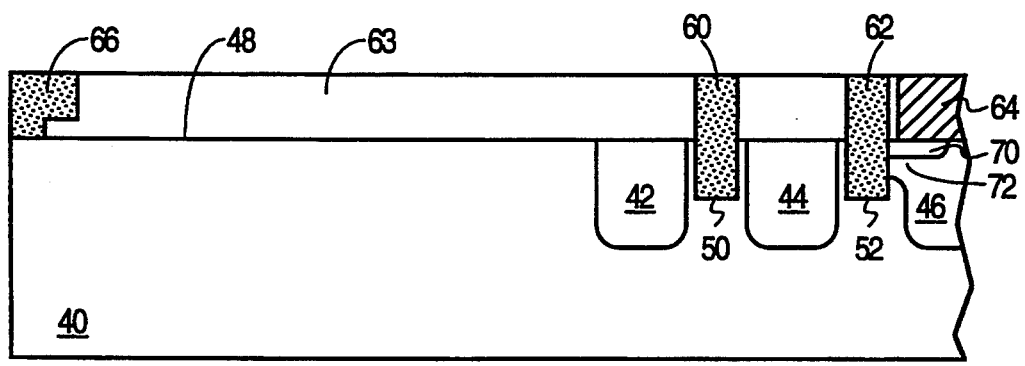
FIG. 4a shows in cross section another embodiment of field rings and trenches in accordance with the invention.
Figure 4B:
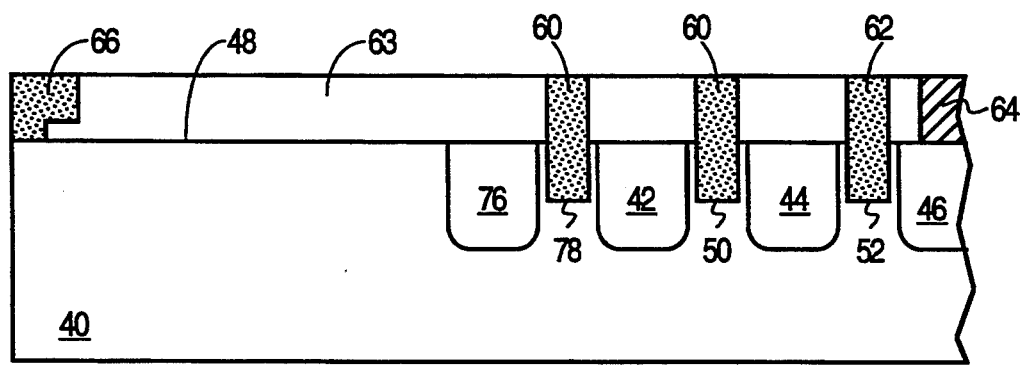
FIG. 4b shows in cross section another embodiment of field rings and trenches in accordance with the invention.
Figure 4C:
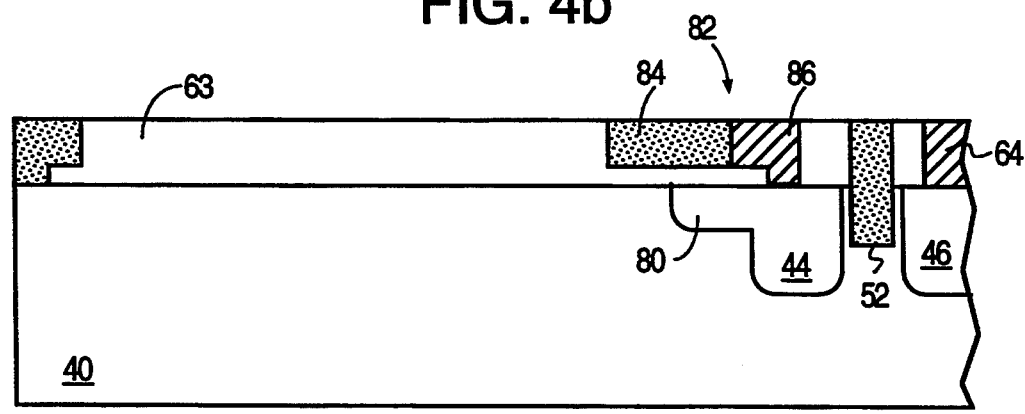
FIG. 4c shows in cross section another embodiment of a field ring, trench, and a field plate in accordance with the invention.

FIGS. 4a, 4b, and 4c show other embodiments of the invention.

FIG. 4a shows a structure identical to that of FIG. 3 except that two additional doped regions 70, 72 are present in the left hand portion of the deep body region 46. Regions 70, 72 are respectively a source and body region of an active transistor cell. Thus no dummy cell is present here, unlike FIG. 3.

FIG. 4b shows another embodiment similar to that of FIG. 3 with an additional field ring 76 and trench 78 for improved breakdown voltage performance.

FIG. 4c shows another embodiment with field ring 44 separated by a trench 52 from active cell deep body region 46. Field ring 44 includes an additional shallow body region 80 which is formed at the same as the shallow body region (not shown) of the active transistor cells. Field ring 44 is electrically contacted by a field plate 82 including doped polysilicon portion 84 and metal portion 86. The advantage of shallow body region 80 in the field ring 44 is that for certain field ring junction depths and doping it can enhance the breakdown voltage of the field ring.

As suggested above, structures in accordance with the invention may be used for both gated channels in trenches or for gates which are formed on the surface of the substrate. The outermost cell of the active portion of the transistor may be active or nonactive (dummy). The innermost trench may electrically contact the active transistor gate electrodes by depositing a second polysilicon or metal layer thereover which is in contact with the gate electrode of the active portion of the transistor.

The number of field rings may be from one up to any number necessary to achieve the breakdown voltage that is required. Where there is only one field ring the trench is used to closely space the single field ring from the outermost active cell of the transistor. The number of field rings is only limited by the breakdown voltage for the resistivity of the semiconductor substrate material. The trench dimensions as to both depth and width may vary according to the junction depth of the field rings, and their lateral extent and in accordance with the resistivity of the semiconductor substrate material.

Advantageously, the structures and methods in accordance with the invention eliminate one masking step as required with a conventional field plate and one high temperature step, i.e. formation of a thick gate oxide, and yet still achieve edge breakdown voltage far in excess of that of the active cell transistor portion of the transistor breakdown voltage. These characteristics are especially beneficial when high breakdown voltages are required and shallow junctions are required in accordance with high cell density.

A process for forming the trench structures in accordance with the invention and using six masking steps is described hereinafter. It will be appreciated that this is only one possible process for forming these structures. This process is also disclosed in copending U.S. Pat. No. 5,316,959 issued on May 31, 1994, and commonly owned, having attorney docket No. M-2139 and entitled "Trenched DMOS Transistor Process Using Six Masks", inventors Sze-Hon Kwan, Iuan Hshieh, Mike Chang, Yueh-Se Ho, and King Owyang, incorporated herein by reference.

Figure 5A:
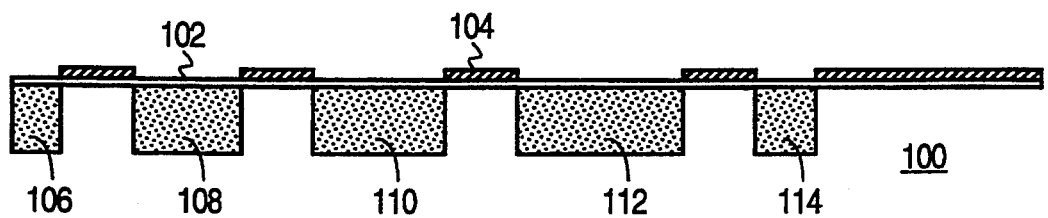
FIG. 5a to 5j show in cross section process steps in accordance with the invention.
Figure 5B:
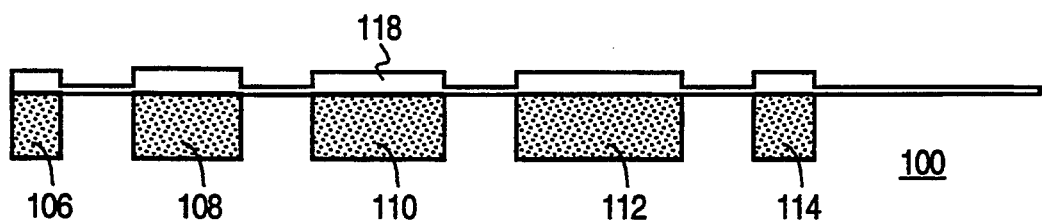

In FIG. 5a an N-channel process in accordance with the invention uses an N− doped epitaxial layer 100 formed on an N+ doped substrate (not shown). A layer of thin silicon dioxide 102 is thermally grown on the principal surface of the substrate 100 and a mask layer of silicon nitride 104 is deposited thereon. Silicon nitride mask layer 104 is patterned and etched. Then boron is predeposited through the mask layer 104 and driven in to form a P+ deep body regions 106, 108 and P+ field rings 110, 112, 114. This is followed by local oxidation 118 of silicon in FIG. 5b followed by stripping of the nitride mask layer to form both the active transistor cells and the device termination as described above. (It is to be understood that in FIGS. 5a to 5j, unlike FIGS. 3 to 4, the device termination region is located at the right hand side of the figures and the central active cell portion of the transistor is at the left hand portion of the figures. Also, FIGS. 5a to 5j show the process steps schematically and do not accurately depict the actual shapes of the various depicted structures.)

Figure 5C:
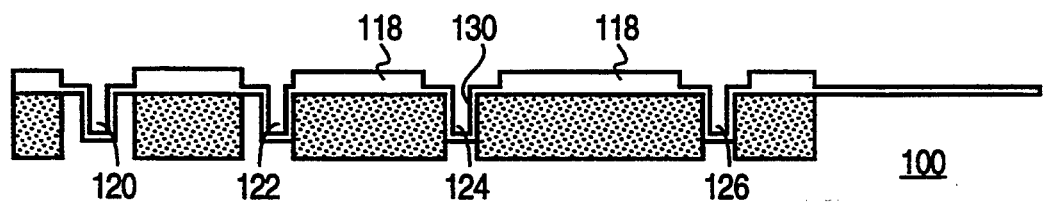

Then in FIG. 5c a second LTO (low temperature oxide) mask layer (not shown) is patterned and the trenches 120, 124, 124, 126 are formed by anisotropic reactive ion dry etching. Trenches 120, 122 serve as the gate electrode trenches and trenches 124,126 separate the field rings. After the trench walls are smoothed by sacrificial oxide growth and stripping of the sacrificial oxide, the gate oxide layer 130 is conventionally grown on the sidewalls of the trenches 120, . . . , 126.

Figure 5D:
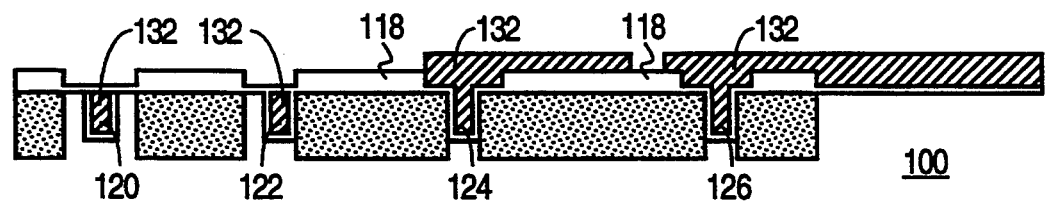
Figure 5E:
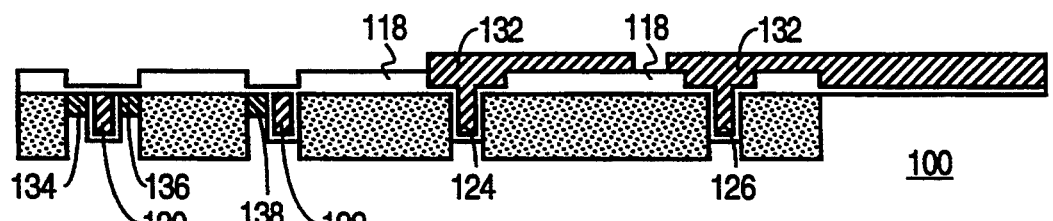
Figure 5F:
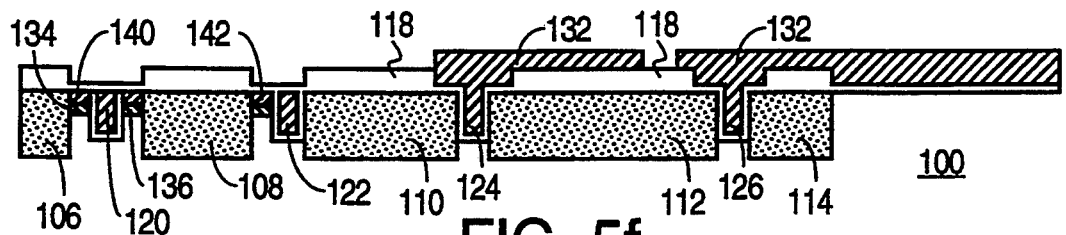

Then in FIG. 5d the trenches are planarized by the deposition of a layer of polycrystalline silicon 132 which is at least as thick as the width of each trench. This relatively thick polysilicon layer 132 is partially etched down and doped to planarize the surface before the masking and polysilicon etching is performed, to form the structure in FIG. 5d. This is followed in FIG. 5e by a blanket P+ body implant and diffusion forming doped regions 134, 136, 138 and an N+source implant and diffusion in FIG. 5f forming regions 140, 142.

Figure 5G:
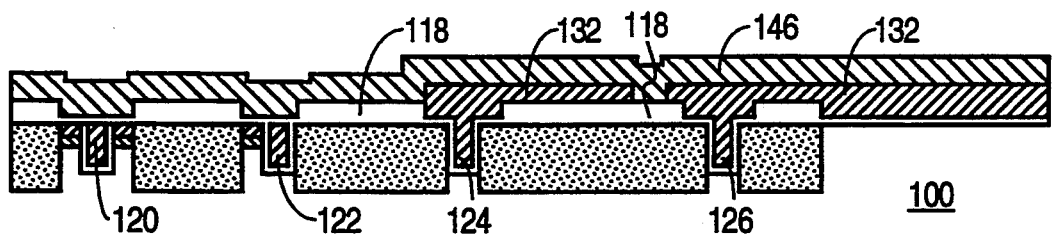
Figure 5H:
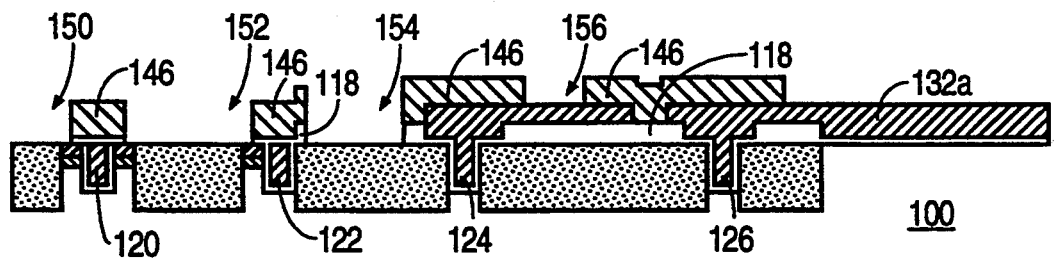

Then in FIG. 5g a layer of boro-phosphosilicate glass 146 is deposited over the entire structure. Then in FIG. 5h boro-phosphosilicate glass layer 140 is masked and patterned to define the electrical contact openings 150, 152, 154, 156 to the transistor structure. The polysilicon layer 132a at the edge termination is also defined by this mask step.

Figure 5I:
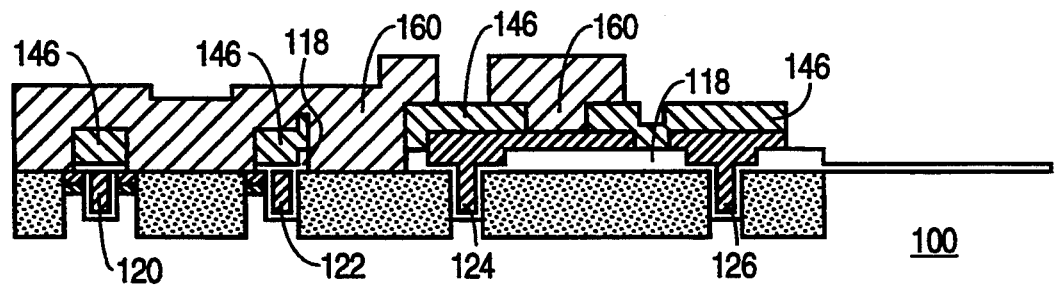
Figure 5J:
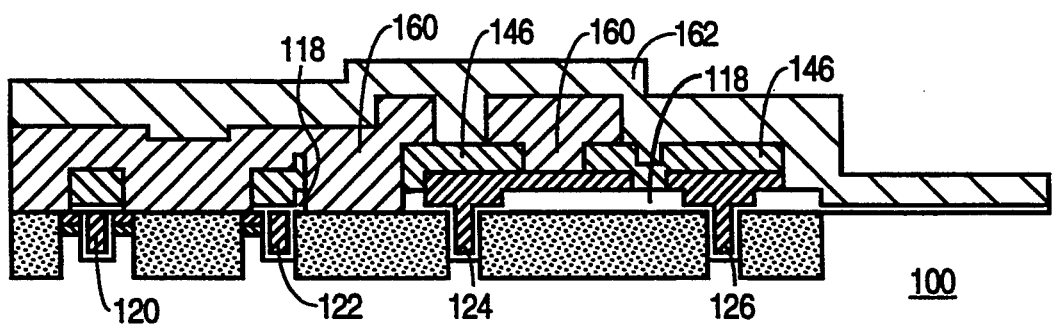

Then in FIG. 5i a layer of metal 160 (e.g. aluminum) is deposited over the entire structure and etched using a conventional metal mask. The polysilicon 132a at the edge termination as previously defined by the contact mask is also etched in this same step. Then in FIG. 5j a passivation layer 162 is deposited and by a mask step bonding pads (not shown) for the gate and source area are opened therethrough.

It is to be understood that the above-described process is for an N-channel vertical DMOS transistor device. By reversal of the polarities to the opposite type, a P-channel vertical DMOS transistor structure may also be formed.

The above description is illustrative and not limiting; further modifications will be apparent to one skilled in the art in light of this specification and the appended claims.

I claim:

1. A high voltage transistor structure including at least one transistor having at least two doped regions formed in a substrate, and a gate electrode, and comprising:

at least a first field ring and a second field ring of similar width and depth as the first field ring and spaced apart from the first field ring, both field rings being formed in the substrate and both laterally surrounding the transistor;

a first insulated trench formed in the substrate in the space between the first and second field rings, the first insulated trench laterally surrounding the transistor;

a deep body region formed in the substrate; and a gate electrode formed in a gate trench in the substrate;

wherein a depth and doping level of the first and second field rings are the same as that of the deep body region, and the depth and width of the first insulated trench are the same as that of the gate trench.

2. The device of claim 1, wherein an insulating layer is formed on the sidewalls of the first insulated trench and the first insulated trench is filled with a conductive material.

3. The device of claim 1, wherein the first and second field rings extend into the substrate to a depth greater than that of the first insulated trench.

4. The device of claim 1, further comprising a conductive guard ring formed overlying the substrate and laterally surrounding both field rings.

5. The device of claim 1, wherein both field rings are doped regions.

6. The device of claim 1, further comprising:
a third field ring formed in the substrate and laterally surrounding the first and second field rings; and
a second insulated trench formed in the substrate between the third field ring and the second field ring.

7. The device of claim 6, wherein the first insulated trench is at least partially filled with a conductive material and an insulating layer is formed on the sidewalls of the first insulated trench.

8. The device of claim 1, wherein the first insulated trench has sidewalls vertical with respect to a principal surface of the substrate, and respectively adjacent to vertical sides of the first and second field rings.

9. The device of claim 1, wherein the first insulated trench has a width of 1 to 2 microns.

10. The device of claim 1, wherein the device has a breakdown voltage in the range of 20 to 150 volts.

11. A high voltage transistor structure including at least one transistor having at least two doped regions formed in a substrate, and a gate electrode, and comprising:
at least a first field ring and a second field ring spaced apart from the first field ring, both field rings being formed in the substrate and both laterally surrounding the transistor; and
an insulated trench formed in the substrate in the space between the first and second field rings, the insulated trench laterally surrounding the transistor;
wherein the transistor is a field effect transistor and also includes a deep body region, and said gate electrode of the transistor is formed in a gate trench, wherein the depth and doping level of the field rings are the same as that of the deep body region, and the depth and width of the insulated trench are the same as that of the gate trench.

* * * * *